United States Patent [19]

Kudo et al.

[11] Patent Number: 5,691,100
[45] Date of Patent: Nov. 25, 1997

[54] PATTERN FORMING MATERIAL INCLUDING PHOTOACID AND PHOTOBASE GENERATORS FOR LARGE EXPOSURE LATITUDE

[75] Inventors: Takanori Kudo, Sayama; Seiya Masuda, Tokorozawa; Yoshiaki Kinoshita, Tokyo, all of Japan; Klaus Przybilla, Frankfurt, Germany; Natsumi Endo, Kawagoe, Japan; Natsumi Suehiro, Kawagoe, Japan; Hiroshi Okazaki, Kawagoe, Japan

[73] Assignee: Hoechst Japan Limited, Tokyo, Japan

[21] Appl. No.: 623,735

[22] Filed: Mar. 29, 1996

Related U.S. Application Data

[63] Continuation of Ser. No. 296,361, filed as PCT/JP93/01858, Dec. 22, 1993, published as WO94/15260, Jul. 7, 1994, abandoned.

[30] Foreign Application Priority Data

Dec. 25, 1992 [JP] Japan ..................... 4-347042

[51] Int. Cl.$^6$ .................. G03C 1/54; G03C 1/56; G03C 1/685
[52] U.S. Cl. .................. 430/170; 430/270.1; 430/919; 430/920; 430/921; 522/25; 522/26; 522/27; 522/28
[58] Field of Search .................. 430/270.1, 326, 430/170, 919, 920, 921; 522/25, 26, 27, 28

[56] References Cited

U.S. PATENT DOCUMENTS

| | | | |
|---|---|---|---|
| 5,110,708 | 5/1992 | Kim | 430/270 |
| 5,262,280 | 11/1993 | Knudsen et al. | 430/280 |
| 5,286,602 | 2/1994 | Pawlowski et al. | 430/270 |

OTHER PUBLICATIONS

Winkle et al., Acid Hardening Positive Photoresist using Photochemical Generation of Base, J. of Photopolymer Sci. & Tech. vol. 3, Nov. 1990 pp. 419–422.

*Primary Examiner*—George F. Lesmes
*Assistant Examiner*—Bernard P. Codd
*Attorney, Agent, or Firm*—Foley & Lardner

[57] ABSTRACT

A material for the formation of a pattern is provided which has a wide exposure latitude and is less liable to cause a dimensional change of a pattern with a change in exposure. The material comprises (A) a compound having a capability of producing an acid upon irradiation with an active beam, (B) a compound capable of producing a base or increasing its basicity, (C) a compound having at least one bond clearable with an acid and/or (D) a compound insoluble in water but soluble in an aqueous alkaline solution.

9 Claims, No Drawings

PATTERN FORMING MATERIAL INCLUDING PHOTOACID AND PHOTOBASE GENERATORS FOR LARGE EXPOSURE LATITUDE

This application is a continuation of application Ser. No. 08/296,361, filed Aug. 25, 1994 now abandoned.

BACKGROUND OF THE INVENTION

This application claims the benefit of the earlier filing date of. International application PCT/JP93/01858 under 35 U.S.C. §§120 and 365(c).

The present invention relates to a pattern formation material used in the formation of a desired pattern on a substrate in the production of a semiconductor device. More particularly, it is concerned with a material for the formation of a pattern that has a particularly large exposure latitude and is less likely to cause a dimensional change with a change in exposing energy.

Various chemical amplification resists are known in the art. In this type of resist, a pattern is formed by irradiating the resist with an active beam to produce an acid, (heat-)decomposing or (heat-)crosslinking a polymer in the presence of the resultant acid as a catalyst to cause a change in solubility of the polymer. These chemical amplification resists are described in, for example, E. Reichmanis, S. A. MacDomald, T. Iwayanagi, ACS Symp. Ser., 412, 25–112 (1989). They are known to have relatively good sensitivity and resolution.

It is also known to form a pattern by a method which comprises combining a material capable of producing an acid upon heating with a material capable of producing a base upon irradiation with an active beam, effecting heating after irradiation to heat-crosslink a polymer in its unexposed portion in the presence of an acid produced by the heating with the resultant acid in the polymer in its exposed portion being neutralized with a base produced by irradiation to inhibit heat-crosslinking caused by the acid in the exposed portion. This resist is described as a resist having a particularly high sensitivity in, for example, S. Matuszazak et al, J. Mater. Chem., 1, 1045 (1991).

On the other hand, apart from the above-described chemical amplification resists, a resist comprising a photosensitive composition and, added thereto, a photochromic dye, such as spiropyran, is also known in the art.

For example, a proposal has been made on a method wherein a photochromic dye having a sensitizing capability or a photochromic dye having a desensitizing capability is added to a resist to modify the sensitivity (see Japanese Patent Publication No. 32662/1986). Further examples of the above-described type of resist include a resist material comprising a positive-working resist and spiropyran added thereto for the purpose of making it possible to form any of a positive-working pattern or a negative-working pattern (see Japanese Patent Laid-Open No. 35130/1981) and a photoresist having improved adhesion to a substrate and resolution and comprising a combination of a negative-working resist for an electron beam with a positive-working resist for ultraviolet rays and a photochromic material (see Japanese Patent Publication No. 3210/1991).

However, neither a chemical amplification resist containing a material capable of producing an acid upon irradiation and a material capable of producing a base upon irradiation nor a method useful for improving the exposure latitude of the above chemical amplification resist is known in the art.

In the above-described prior art, no consideration is given to process control in the application of the resists to the production of semiconductor devices or the like. In particular, the chemical amplification resists had a problem that the dimension of the pattern remarkably changes with a variation in exposure.

For example, when these resists are exposed using a line-and-space pattern, a slight increase in exposure renders the line slimming in the case of a positive-working resist or renders the line widening in the case of a negative-working resist, so that it is difficult to regulate the dimension of the pattern.

An object of the present invention is to provide a material for the formation of a pattern that has a particularly large exposure latitude and is less likely to cause a dimensional change with a change in exposing energy.

DISCLOSURE OF THE INVENTION

Under the above-described circumstances, the present inventors have made extensive and intensive studies and, as a result, have found that the exposure latitude can be significantly improved by adding a compound capable of producing a base or increasing its basicity upon irradiation to a chemical amplification resist in which a pattern is formed by irradiating the resist with an active beam to produce an acid, decomposing or crosslinking a polymer in the presence of the resultant acid as a catalyst to cause a change in solubility of the polymer.

Specifically, the material for the formation of a pattern comprises (A) a compound having a capability of producing an acid upon irradiation with an active beam, (B) a compound capable of producing a base or increasing its basicity upon irradiation with an active beam, (C) a compound having at least one bond cleavable with an acid and/or (D) a compound insoluble in water but soluble in an aqueous alkaline solution.

Examples of the compound capable of producing an acid upon irradiation with an active beam include $HSbF_6$, $HAsF_6$ or $HPF_6$ (see J. V. Crivello, Polym. Eng. sci., 23, 953 (1983)), a diazonium salt, a phosphonium salt, a sulfonium salt or an iodonium salt of $RSO_3H$ wherein R represents an alkyl group, an aromatic group or a fluoroalkyl group; and halogen compounds (see Japanese Patent Laid-Open No. 106039/1989, EP-A 0232972, US-A 3,615,455, US-A 3,686,084 and US-A 3,912,616), particularly trichloromethyltriazine derivatives (see DE-A 1298414, DE-A 2,243,621, DE-A 2,306,248, DE-A 2,306,249, US-A 4,619,998 and US-A 4,696,888) or trichloromethyloxadiazole derivatives (see US-A 4,212,970, US-A 4,279,982, US-A 4,371,106, US-A 4,371,606); a phenolic ester of sulfonic acid (see T. Ueno et al., Polymers for Microelectronics, 413–424 (1990)) or a nitrobenzyl ester of sulfonic acid (see F. M. Houlian et al., Macromol., 21, 2001 (1988)); and bissulfonyldiazomethane (see Japanese Patent Laid-open No. 103854/1991). Examples of the bissulfonyldiazomethane include those represented by the following general formula:

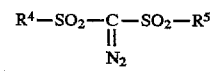

wherein $R^4$ and $R^5$ each independently represent an alkyl group, a cycloalkyl group, an aromatic group or a heteroaryl group.

Examples of the compound capable of producing a base upon irradiation with an active beam include those having a carbamate group (particularly a 2-nitrobenzyl-carbamate group) or a sulfonamide group and represented by the following general formulae:

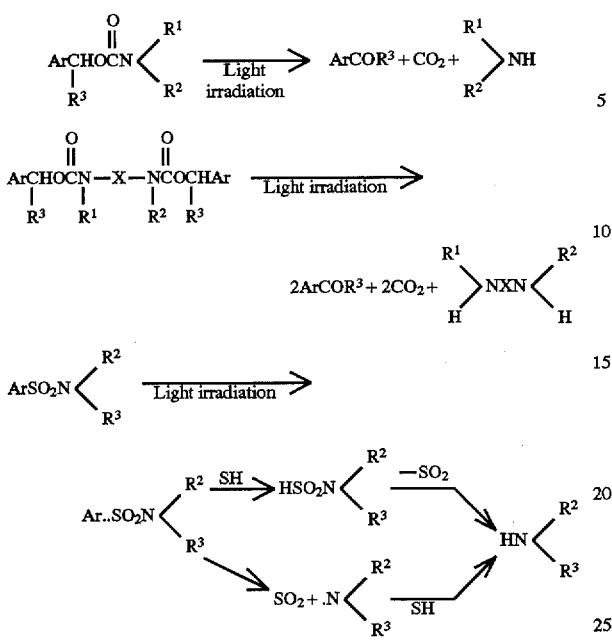

wherein Ar represents a nitro-substituted aromatic group or an aromatic group, $R^1$ $R^2$ and $R^3$ represent a hydrogen atom, an alkyl group or an aromatic group and X represents an alkylene group.

More specific preferred examples of the compound capable of producing a base upon irradiation with an active beam include nitrobenzylcyclohexyl carbamate, 3,5-dimethoxybenzylcyclohexyl carbamate, 3-nitrophenylcyclohexyl carbamate, benzylcyclohexyl carbamate, [[(2-nitrobenzyl)oxy]carbonyl] cyclohexylamine, [[(2-nitrobenzyl)oxy]carbonyl]piperidine, bis[[(2-nitrobenzyl)oxy]carbonyl]piperazine, bis[[(2-nitrobenzyl)oxy]carbonyl]hexene-1,6-diamine, [[(2,6-dinitrobenzyl)oxy]carbonyl]cyclohexylamine, bis[[(2,6-dinitrobenzyl)oxy]carbonyl]hexene-1,6-diamine, N-[[(2-nitrophenyl)-1-methylmethoxy]carbonyl]cyclohexylamine, N-[[(2-nitrophenyl)-1-methylmethoxy]carbonyl]-octadecylamine, bis[[(α-methyl-2-nitrobenzyl)oxy]-carbonyl]hexane-,1,6-diamine, N-[[(2,6-dinitrophenyl)-1-methylmethoxy]carbonyl]cyclohexylamine, N-[[(2-nitrophenyl)-1-(2'-nitrophenyl)methoxy]carbonyl-cyclohexylamine, N-[[(2,6-dinitrophenyl)-1-(2'6'-dinitrophenyl)methoxy]carbonyl]cyclohexylamine, N-cyclohexyl-4-methylphenyl sulfonamide and N-cyclohexyl-2-naphthylsulfonamide.

Examples of the compound capable of increasing its basicity upon irradiation with an active beam include spiropyrans and spiroxazines represented by the following general formulae. These compounds give rise to the following isomerization upon irradiation.

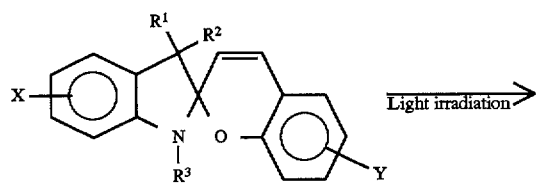

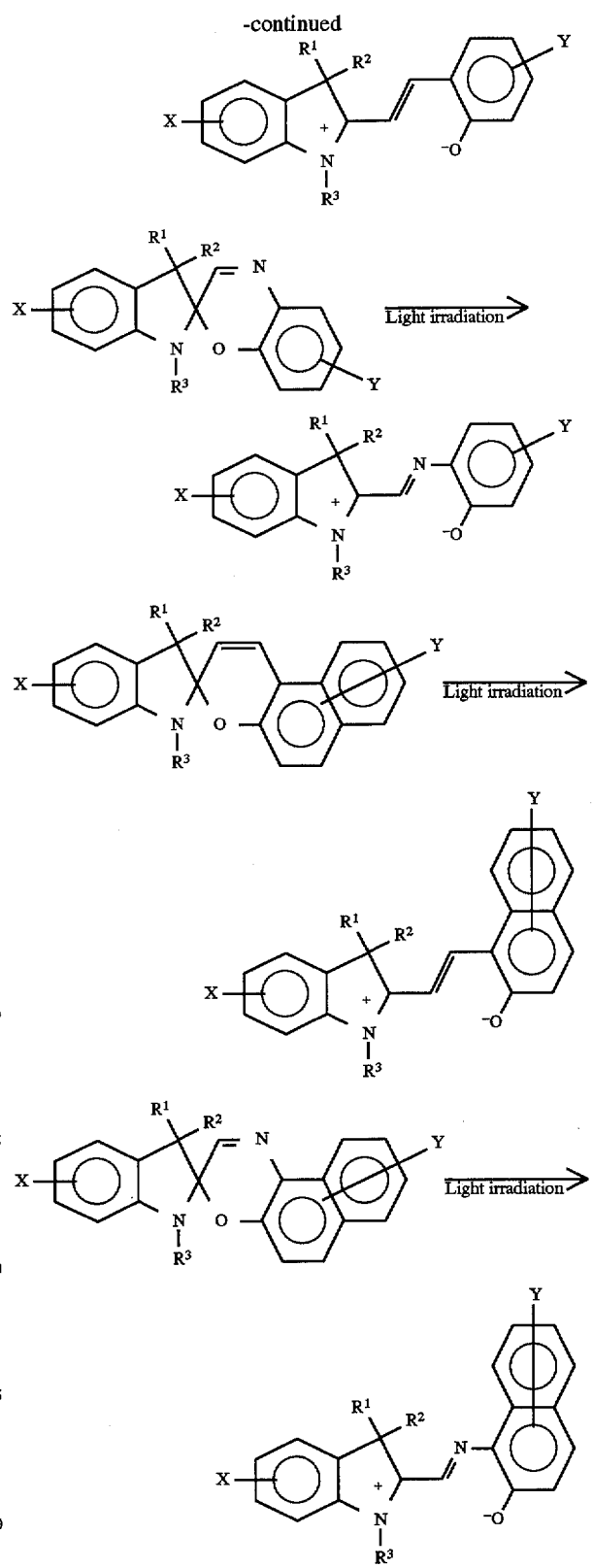

wherein $R^1$, $R^2$ and $R^3$ which may be the same or different each independently represent a hydrogen atom or an alkyl group and X and Y which may be the same or different each independently represent an alkyl group, an alkoxy group, a halogen atom, a nitro group or a hydrogen atom.

Since these compounds have an amino group in their molecule, they are basic. Irradiation causes the compounds to be isomerized to provide a phenolate ion that increases the basicity of the compounds.

Specific examples of the spiropyrans and spiroxazines include 1,3,3-trimethylindolino-benzopyrylospiran, 1,3,3-trimethylindolino-8'-methoxybenzopyrylospiran, 1,3,3-trimethylindolino-β-naphthopyrylospiran, 1,3,3-trimethylindolino-naphthospiroxazine, 1,3,3-trimethylindolino-6'-nitrobenzopyrylospiran, 1,3,3-trimethylindolino-6'-bromobenzopyrylospiran, 1,3,3-trimethylindolino-6'-hydroxybenzopyrylospiran.

The material capable of producing a base upon irradiation with an active beam or the material capable of producing its basicity upon irradiation with an active beam is added to a chemical irradiation resist in which an acid is produced by active beam irradiation and used as a catalyst to decompose or crosslink a polymer, thereby providing a material that can be used as the material for the formation of a pattern according to the present invention.

In some cases, the sensitivity and resolution lower with an increase in total content of the compound (B) capable of producing a base or increasing its basicity upon irradiation. For this reason, the total context of the compound (B) is preferably in the range of from 200 to 0.1% by mole, still preferably in the range of from 50 to 0.2% by mole, based on the compound (A) capable of producing an acid upon irradiation.

For example, UV light in a region from 190 to 450 nm, preferably a region from 200 to 400 nm, particularly preferably in a region from 200 to 300 nm, may be used as the light source used for irradiation. Further, electron beams and X-rays are also favorably used as the active beam source.

It is known-that the following compounds are particularly favorable as the compound (C) having at least one bond cleavable with an acid, preferably a C bond and/or a C—N—C bond, expressed by the following general formula:

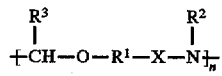

wherein $R^1$ represents an alkylene group having 1 to 4 carbon atoms, $R^2$ represents an alkyl group having 1 to 4 carbon atoms, $R^3$ represents an alkyl or aryl group having 1 to 10 carbon atoms, X represents a group selected from the group consisting of —CO—, —OCO— and —NHCO— and n is an integer of 1 or more.

a) compounds having at least one o-carboxylic acid ester and/or carboxylic acid amide acetal group;

b) oligomers or polymers having repeating acetal and/or ketal groups in their main chain;

c) compounds having at least one enol ether or N-acylaminocarbonate group;

d) cyclic acetals or ketals of β-ketoesters or β-ketoamides;

e) tertiary alcohol ethers; and f) carboxylic acid esters and carbonic acid esters of tertiary allyl or benzyl alcohols.

More specific examples of the compound a) include those disclosed in DE-A 2,610,842 and DE-A 2,928,636, more specific examples of the compound b) include those disclosed in DE-C 2,306,248 and DE-C 2,718,254, more specific examples of the compound c) include those disclosed in EP-A 0.006,626 and EP-A 0.006627, more specific examples of the compound d) include those disclosed in EP-A 0.202,196, more specific examples of the compound e) include those disclosed in US-A 4,603,101, and more specific examples of the compound f) include those disclosed in US-A 4,491,628 and J. M. Frechet et al., J. Imaging Sci., 50, 59–64 (1986). Further examples of the compound (C) include acetal resins described in DE-A 3,730,783, G. Powlowski et al., J. Photopolym. Sci., Technol., 5, 55–60 (1992), Japanese Patent Publication No. 106041/1989 and Japanese Patent Publication 20738/1985 and t-butoxycarboxylates described in M. J. O. Brien et al., SPIE Symp. Proc., 920, 42 (1980). Preferred examples of the compound (C) include compounds represented by the following general formula:

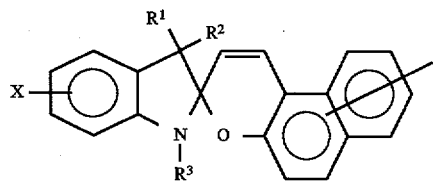

Compounds falling within the scope of the compound (D) include phenolic resins, such as polyvinyl phenol and novolak resins, and their derivatives. Further, it is also possible to use compounds produced by protecting the OH group of the above-described phenolic resins with a tetrahydrofuranyl group, a tetrahydropiranyl group, a t-butoxycarboxyl group, an acetoxy group or the like to introduce a C—O—C bond cleavable with an acid.

More specific favorable examples thereof include polyhydroxystyrene and its alkyl derivatives, for example, a homopolymer or a copolymer of 3-methyl-4-hydroxystyrene or an ester or an amide of acrylic acid with an aromatic compound having a phenol group. It is also possible to use styrene, methacryloyl methacrylate, acryloyl methacrylate or other monomers as a comonomer in the copolymer.

A material having an enhanced resistance particularly to plasma etching is provided when the above-described type of copolymers are prepared by using a silicon-containing vinyl monomer, for example, vinyltrimethylsilane. The transparency of these materials is generally high in a region where high transparency is required, so that the configuration of the pattern can be improved.

The same effect can be obtained when a homopolymer or a copolymer of maleinimide is used.

It is also possible to use as the comonomer styrene, substituted styrene, vinyl ether, vinyl ester, vinylsilyl compound and (meth)acrylic ester.

The copolymer of styrene may be used in combination with a comonomer capable of increasing the solubility in an aqueous alkaline solution, and examples thereof include maleic anhydride and semi-esters of maleic acid.

It is also possible to use a mixture of the above-described materials. Further, it is also possible to improve a film forming property, a coatability, an adhesion and other properties by adding polyglycols, cellulose esters, etc. besides dyes, pigments, wetting agents and leveling agents. Preferably, the material for the formation of a pattern according to the present invention is dissolved in, for example, ethylene glycol, glycol ether, glycol monomethyl ether, glycol dimethyl ether, glycol monoethyl ether or propylene glycol monoalkyl ethers, aliphatic esters (for example, ethyl acetate, n-butyl acetate, propylene glycol monoalkyl ether acetate, particularly propylene glycol monomethyl ether acetate or amyl acetate), ketones (for example, methyl ethyl ketone, cyclopentanone and cyclohexanone), dimethylformamides, dimethylacetamide, hexamethylphosphoric amide, N-methylpyrrolidone, butyrolactone, tetrahydrofuran and a mixture thereof. Glycol ethers, aliphatic esters and ketones are particularly preferred.

The solvent that is finally selected is determined depending upon the coating method used, desired film thickness and drying conditions. As a general rule, the solution prepared from the material for the formation of a pattern has a solid content of 5 to 60% by weight, preferably up to 50% by weight.

In the material for the formation of a pattern, the proportions of the indispensable components are determined depending upon the sensitivity to light applied in the formation of a pattern, the configuration of a pattern, etc.

Although the proportions of the components vary depending also upon the materials used in combination, they are generally as follows. The content of the compound (A) capable of producing an acid upon irradiation is generally in the range of from 0.5 to 25% by weight, preferably in the range of from 1 to 10% by weight, based on the total weight of the solid matter.

The content of the compound (C) having at least one bond cleavable with an acid is generally in the range of from 1 to 60% by weight, preferably in the range of from 5 to 35% by weight, based on the total weight of the solid matter.

The content of the compound (D) insoluble in water but soluble in an aqueous alkaline solution is generally in the range of from 1 to 90% by weight, particularly in the range of from 5 to 90% by weight, preferably in the range of from 50 to 90% by weight, based on the total weight of the solid matter. The compounds (C) and (D) may be identical to each other. In this case, the content of the compound is generally in the range of from 75 to 99.5% by weight, preferably in the range of from 80 to 99% by weight, based on the total weight of the solid matter.

Specific examples of the above-described chemical amplification resist include those described in E. Reichmanis et al., ACS Symp. Ser., 412, 25–112 (1989), E. Reichmanis et al., Chem. Mater., 3, 394–407 (1991), L. Schlegel et al., Microelec. Eng., 13, 33 (1991) and the like.

All materials for constituting or producing capacitors, semiconductors, multilayer printed board circuits or integrated circuits may be used as the substrate to be coated with the material of the present invention. Specific examples of the substrate include thermally oxidized and/or optionally doped silicon materials, aluminum-coated silicon materials and other materials commonly used as the substrate in semiconductor production techniques, for example, silicon nitride, gallium-arsenic and indium phosphide.

Further, substrates known in the production of liquid crystal display devices, for example, glass and indium-tin and, further, metallic sheets and metallic foils (for example, aluminum, copper or zinc) or metallized surface, optionally aluminum-coated $SiO_2$ material and paper are favorable.

These substrates may be treated by heating, surface polishing or etching or with a reagent to improve properties, for example, to enhance the hydrophilicity.

Specifically, in order to improve the adhesion between the resist and the substrate, it is possible to incorporate an adhesion accelerator, and when the substrate comprises silicon or silicon dioxide, silane coupling agents, such as 3-aminopropyltriethoxysilane and hexamethyldisilazane, may be applied as the adhesion accelerator.

Although the thickness of the layer varies depending upon the field of utilization, it is, for example, in the range of from 0.1 to 100 pm, particularly in the range of from 1 to 10 pm.

The material according to the present invention may be applied, for example, in a solution form on the substrate by spray coating, roll coating, spin coating or dip coating. Then, the solvent is removed by evaporation to leave the material for the formation of a pattern on the substrate. If necessary, the removal of the solvent can be accelerated by heating and/or pressure reduction. It is important for the heating to be effected at such a temperature as will not cause any deterioration in the material for the formation of a pattern and the substrate. For example, the assembly may be heated to, for example, 150° C. Then, the layer is irradiated so that a pattern is reflected on the layer. Subsequently, the layer is treated with a developing solution to dissolve exposed portions to develop the pattern. In some materials, the exposed portions may be insolubilized with the unexposed portions being dissolved to develop a pattern. Further, it is also possible to develop the layer after heating subsequent to the irradiation. Heating is preferably effected at such a temperature as will not cause any deterioration in configuration of the pattern and the substrate, and the temperature may be, for example, 200° C. or below.

Examples of the developing solution include a silicate, a metasilicate, a hydroxide and a hydrogen phosphate of an alkali metal and/or an alkaline earth metal, particularly an ammonium ion, and ammonia.

Further, it is also possible to use, as a developing agent not containing a metallic ion, known developing solutions described in, for example, US-A 4,729,941 and EP-A 0.062, 733.

In addition, it is also possible to apply, for example, a film for reflection prevention, contrast improvement and other purposes on and/or under the layer comprising the material for the formation of a pattern according to the present invention. The film for these purposes is disclosed in, for example, C. F. Cyons et al., SPIE Proc., 1674, 523 (1992), T. Tanaka et al., J. Electrochem Soc., 137, 3990 (1990), T. Iwayanagi et al., J. Electrochem. Soc., 134, 963 (1987), S. Uchino et al., ACS Symposium Series, 346, 188 (1987) and the like.

In view of the finding obtained up to now, the reason why the material for the formation of a pattern according to the present invention exhibits an excellent exposure latitude is believed to reside in the following mechanism.

Specifically, when no compound capable of producing a base or increasing the basicity upon irradiation is contained as in the conventional chemical application resists, since an increase in the exposure gives rise to a rapid increase in the concentration of proton serving as a catalyst for the pattern formation reaction, the dimension of the pattern is remarkably changed.

By contrast, in the material of the present invention, since a compound capable of producing a base or increasing the basicity upon irradiation is contained, the concentration of proton increases with an increase in the exposure while the concentration of the base for neutralization of the acid also increases. Therefore, a change in the concentration of proton with a variation in the exposure is relaxed to provide a kind of buffer effect, which contributes to an improvement in the exposure latitude.

EXAMPLES

The present invention will now be described in more detail with reference to the following examples, though it is not limited to these examples only.

Example 1

A material having the following composition for the formation of a pattern was prepared.

70 parts of poly[(3-methyl-4-hydroxystyrene)$_2$—CO—(4-hydroxystyrene)](average molecular weight (MW): 16,000) and 30 parts by weight of a polyacetal (average molecular weight (MW): 2,800) represented by the following structural formula:

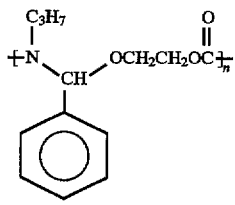

were mixed with 2 parts by weight of α, α'-bis(4-chlorophenyl)diazomethane as a compound capable of producing an acid upon irradiation. The mixture was dissolved in 400 parts by weight of propylene glycol monomethyl ether acetate. 1.6% by mole, based on α, α'-bis(4-chlorophenyl)diazomethane, of 1,3,3-trimethylindolino-8'-methoxybenzopyrylospiran (abbreviated to as "SP") was added to the above-described solution. The mixture was filtered with a filter having a pore diameter of 0.2 μm and then spin-coated at 3500 rpm on a wafer treated with an adhesion accelerator (hexamethyldisilazane). The thickness of the resultant coating after heating at 120° C. on a hot plate for 1 min was 1.0 μm.

The reproducing material was placed under an original picture and irradiated with an ultraviolet light having a wavelength of 248 nm by using a KrF excimer laser. After the completion of the irradiation, the material was heated at 60° C. on a hot plate for 1 min and then subjected to development with a 0.27N aqueous tetramethylammonium hydroxide solution.

The resist was subjected to an examination of a pattern profile under a scanning electron microscope. The results are given in Table 1.

Example 2

The procedure of Example 1 was repeated, except that the amount of 1,3,3-trimethylindolino-8'-methoxybenzopyrylospiran was change from 1.6% by mole to 6.4% by mole.

Example 3

The procedure of Example 1 was repeated, except that poly(3-methylhydroxystyrene) was used instead of poly[(3-methyl-4-hydroxystyrene)$_2$ —CO— (4-hydroxy-styrene)].

Example 4

The procedure of Example 1 was repeated, except that the amount of 1,3,3-trimethylindolino-8'-methoxybenzopyrylospiran was changed to 0.8% by mole.

Comparative Example 1

The procedure of Example 1 was repeated, except that a solution of the material for the formation of a pattern was prepared without adding 1,3,3-trimethylindolino-8'-methoxybenzopyrylospiran.

Comparative Example 2

The procedure of Example 3 was repeated, except that a solution of the material for the formation of a pattern was prepared without adding 1,3,3-trimethylindolino-8'-methoxybenzopyrylospiran.

The results of Examples 1 to 4 and Comparative Examples 1 and 2 are given in Table 1.

TABLE 1

| Ex. No. and Comp. Ex. No. | Amount of SP added based on acid generator | Amount of change in configuration of pattern based on ±10% change in exposure |
|---|---|---|
| Ex. 1 | 1.6 | 0.45 ± 0.01 μm |
| Ex. 2 | 6.4 | 0.60 ± 0   μm |
| Ex. 3 | 1.6 | 0.45 ± 0.02 μm |
| Ex. 4 | 0.8 | 0.45 ± 0.02 μm |
| Comp. Ex. 1 | 0 | 0.45 ± 0.05 μm |
| Comp. Ex. 2 | 0 | 0.45 ± 0.05 μm |

The following facts are apparent from the above-described Examples 1 to 4 and Comparative Examples 1 and 2. In Comparative Examples 1 and 2, a change in the exposure within ±10% gave rise to a change in dimension of pattern of ±10% or more, whereas in Examples 1 to 10, a change in the exposure within ±10% gave rise to a change in dimension of pattern in the range of from 0.01 to 0.02 μm, that is, within ±5% or less. That is, it is apparent that all the materials for the formation of a pattern according to the present invention exhibit a good exposure latitude.

As described in detail, in the method for improving the exposure latitude of a material for the formation of a pattern according to the present invention, the incorporation of a compound capable of producing an acid upon irradiation with an active beam and a compound capable of producing a base or increasing the basicity upon irradiation with an active beam offers buffer action against a change in exposure, which can provide a material for the formation of a pattern having an excellent exposure latitude.

Further, it is needless to say that the present invention is useful for both positive-working and negative-working materials for the formation of a pattern and further can work with light sources including not only ultraviolet rays but also visible light, X-rays and electron beams. Moreover, a film, for example, for anti-reflection, contrast improvement and other purposes can be applied on and/or under the layer comprising the material for the formation of a pattern according to the present invention, so that the material of the present invention can be widely put to practical use, which renders the present invention very useful from the viewpoint of industry.

What is claimed is:

1. A material for the formation of a pattern, comprising:

(A)' a compound capable of producing an acid upon irradiation with an active beam, (B) a compound capable of increasing its basicity upon irradiation with an active beam, (C) a compound having at least one bond cleavable with an acid and/or (D) a polymer insoluble in water but soluble in an aqueous alkaline solution, wherein said compound capable of increasing its basicity upon irradiation with an active beam is selected from the group consisting of those represented by the general formula (IV) to (VII):

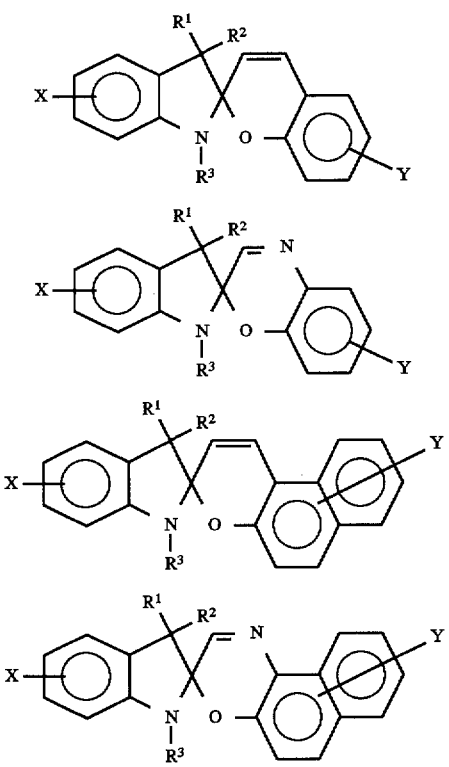

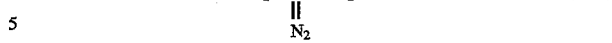

wherein R¹, R² and R³, which may be the same or different from each other, independently represent a hydrogen atom or an alkyl group and X and Y, which may be the same or different from each other, independently represent an alkyl group, an alkoxy group, a halogen group, a nitro group or a hydrogen atom.

2. A material for the formation of a pattern according to claim 1, wherein the bond clearable with an acid in said compound (C) comprises a C—O—C bond and/or a C—N—C bond.

3. A material for the formation of a pattern according to claim 1, wherein said compound (A) capable of producing an acid upon irradiation with an active beam comprises at least one member selected from the group consisting of the following compounds (1) to (4):

(1) a diazonium salt, a phosphonium salt, a sulfonium salt, and an iodonium salt of $HSbF_6$, $HASF_6$, $HPF_6$ or $RSO_3H$ wherein R represents an alkyl group, an aromatic group or a fluoroalkyl group;

(2) a trichloromethyltriazine, or a trichloromethyl-oxadiazole;

(3) a phenolic ester or a nitrobenzyl ester of sulfonic acid; and (4) a bissulfonyldiazomethane.

4. A material for the formation of a pattern according to claim 3, wherein said compound (A) capable of producing an acid upon irradiation with an active beam comprises a bissulfonyldiazomethane represented by the following general formula:

$$R^4-SO_2-\underset{\underset{N_2}{\|}}{C}-SO_2-R^5 \quad (VIII)$$

wherein $R^4$ and $^5$ each independently represent an alkyl group, a cycloalkyl group, an aromatic group or a heteroaryl group.

5. A material for the formation of a pattern according to claim 1, wherein the compound having at least one bond clearable with an acid is selected from the group consisting of a C—O—C bond and a C—N—C bond and is represented by the following general formula (IX):

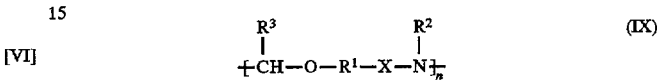

wherein

R¹ represents an alkylene group having 1 to 4 carbon atoms,

R² represents an alkyl group having 1 to 4 carbon atoms,

R³ represents an alky or aryl group having 1 to 10 carbon atoms,

X represents a group selected from the group consisting of —CO—,

—OCO— and —NHCO— and n is an integer of 1 or more.

6. A material for the formation of a pattern according to claim 1, wherein the polymer insoluble in water but soluble in an aqueous alkaline solution is a polymer having a phenolic hydroxyl group.

7. A material for the formation of a pattern according to claim 1, wherein the polymer insoluble in water but soluble in an aqueous alkaline solution is a homopolymer or a copolymer of a vinyl phenol or alkyl-substituted vinyl phenol, a mixture of two or more of them or a mixture thereof with another compound having a phenolic hydroxyl group.

8. A material for the formation of a pattern according to claim 1, wherein the total content of the compound (B) capable of increasing its basicity upon irradiation with an active, beam is in the range of from 200 to 0.1% by mole based on the compound (A) capable of producing an acid upon irradiation with an active beam.

9. A material for the formation of a pattern according to claim 8, wherein the total content of the compound (B) capable of increasing its basicity upon irradiation with an active beam is in the range of from 50 to 0.2% by mole based on the compound (A) capable of producing an acid upon irradiation with an active beam.

* * * * *

UNITED STATES PATENT AND TRADEMARK OFFICE
CERTIFICATE OF CORRECTION

PATENT NO. : 5,691,100
DATED : November 25, 1997
INVENTOR(S) : KUDO, et al.

It is certified that error appears in the above-indentified patent and that said Letters Patent is hereby corrected as shown below:

On title page, item [75] Inventors: correct the name of the fifth inventor to read: --Hajime ENDO--

Signed and Sealed this

Twenty-fourth Day of March, 1998

Attest:

BRUCE LEHMAN

*Attesting Officer*  *Commissioner of Patents and Trademarks*